(12) United States Patent
Li (10) Patent No.: US 10,573,597 B1
(45) Date of Patent: Feb. 25, 2020

(54) ELECTRONIC DEVICE AND MANUFACTURING METHOD THEREOF

(71) Applicant: GIO Optoelectronics Corp, Tainan (TW)

(72) Inventor: Chin-Tang Li, Tainan (TW)

(73) Assignee: GIO OPTOELECTRONICS CORP., Tainan (TW)

( * ) Notice: Subject to any disclaimer, the term of this patent is extended or adjusted under 35 U.S.C. 154(b) by 0 days.

(21) Appl. No.: 16/545,393

(22) Filed: Aug. 20, 2019

(30) Foreign Application Priority Data

Oct. 18, 2018 (TW) .............................. 107136719 A (51) Int. Cl.
| | |
|---|---|
| H01L 23/538 | (2006.01) |
| H01L 27/12 | (2006.01) |
| H01L 25/00 | (2006.01) |
| H01L 23/498 | (2006.01) |
| H01L 25/18 | (2006.01) |

(52) U.S. Cl.
CPC ...... *H01L 23/5385* (2013.01); *H01L 23/4985* (2013.01); *H01L 23/49833* (2013.01); *H01L 25/18* (2013.01); *H01L 25/50* (2013.01); *H01L 27/124* (2013.01)

(58) Field of Classification Search
None
See application file for complete search history.

(56) References Cited

U.S. PATENT DOCUMENTS

| | | | |
|---|---|---|---|
| 2013/0161661 A1* | 6/2013 | Akamatsu | H01L 27/15 257/88 |
| 2017/0147852 A1* | 5/2017 | Benkley, III | H01L 23/5387 |
| 2018/0197471 A1* | 7/2018 | Rotzoll | G09G 3/2007 |
| 2018/0323180 A1* | 11/2018 | Cok | G09G 3/32 |

\* cited by examiner

*Primary Examiner* — J. E. Schoenholtz
(74) *Attorney, Agent, or Firm* — Muncy, Geissler, Olds & Lowe, P.C.

(57) ABSTRACT

An electronic device and manufacturing method thereof are disclosed. The manufacturing method includes steps of: providing a component board, wherein the component board comprises a substrate and a first conductive wire; providing a connecting board, wherein the connecting board comprises a second conductive wire; disposing an attaching member on the connecting board or a lateral face of the substrate; aligning the second conductive wire of the connecting board toward the lateral face, and attaching the connecting board to the lateral face by the attaching member, wherein the lateral face, the attaching member and the connecting board form a recess; and disposing a conductive member in the recess, wherein the conductive member contacts the first conductive wire and the second conductive wire, and the first conductive wire is electrically connected with the second conductive wire through the conductive member.

20 Claims, 6 Drawing Sheets

FIG. 4C under 35 U.S.C.
ELECTRONIC DEVICE AND MANUFACTURING METHOD THEREOF

CROSS REFERENCE TO RELATED APPLICATIONS

This Non-provisional application claims priority under 35 U.S.C. § 119(a) on Patent Application No(s). 107136719 filed in Taiwan, Republic of China on Oct. 18, 2018, the entire contents of which are hereby incorporated by reference.

BACKGROUND

Technology Field

The present disclosure relates to an electronic device and, in particular, to an electronic device with a narrow border design and a manufacturing method thereof.

Description of Related Art

The light-emitting diode is a light-emitting element made by semiconductor materials. The light-emitting diode has two electrode terminals. When a very small voltage is applied between the electrode terminals, the electrons and the holes can be combined to release the remaining energy in the format of light. Different from the ordinary incandescent bulbs, the light-emitting diodes are cold illuminance, which has the advantages of low power consumption, long component life, no need for warming time, and fast response. Moreover, the light-emitting diodes have the features of small size, vibration resistance, and mass production capability, so that they can be easy fabricated as a small or array module to meet the needs of applications. Accordingly, the light-emitting diodes have been widely used in the fields of lighting equipment, information, communication, the indicator of consumer electronics, the backlight module of the display device, and the display device itself. In fact, the light-emitting diodes have become one of the indispensable important components in daily life. Furthermore, the structural design of narrow border electronic devices has always been one of the goals pursued by the industry.

SUMMARY

An electronic device with narrow-border feature and a manufacturing method thereof are provided for making the products more competitive.

The present disclosure provides an electronic device, which comprises a component board, a connecting board, an attaching member, and a conductive member. The component board comprises a substrate and a first conductive wire. The substrate has a first surface and a lateral face, and the first conductive wire is disposed on the first surface. The connecting board comprises a thin substrate and a second conductive wire, wherein the second conductive wire is disposed on the thin substrate and aligned toward the lateral face of the substrate. The attaching member is disposed between the lateral face of the substrate and the second conductive wire of the connecting board, wherein a recess is jointly defined by the lateral face of the substrate, the attaching member and the connecting board. The conductive member is disposed in the recess and contacts the first conductive wire and the second conductive wire. The first conductive wire is electrically connected with the second conductive wire through the conductive member.

The present disclosure also provides a manufacturing method of an electronic device. The manufacturing method comprises steps of: providing a component board, wherein the component board comprises a substrate and a first conductive wire, the substrate has a first surface and a lateral face, and the first conductive wire is disposed on the first surface of the substrate; providing a connecting board, wherein the connecting board comprises a second conductive wire; disposing an attaching member on the connecting board or the lateral face of the substrate of the component board; facing the second conductive wire of the connecting board toward the lateral face of the substrate, and attaching the connecting board to the lateral face of the substrate by the attaching member, wherein a recess is jointly defined by the lateral face of the substrate, the attaching member and the connecting board; and disposing a conductive member in the recess, wherein the conductive member contacts the first conductive wire and the second conductive wire, and the first conductive wire is electrically connected with the second conductive wire through the conductive member.

In one embodiment, the thin substrate of connecting board is a flexible substrate, and the second conductive wire is disposed on a surface of the flexible substrate in which the surface of the flexible substrate aligned toward the lateral face of the substrate.

In one embodiment, the flexible substrate comprises an organic polymer material, and a glass transition temperature of the organic polymer material is between 200° C. and 600° C.

In one embodiment, a thickness of the connecting board is greater than or equal to 10 μm and is less than or equal to 200 μm.

In one embodiment, a material of the conductive member comprises copper paste, silver paste, solder paste, or anisotropic conductive adhesive.

In one embodiment, the electronic device further comprises a control chip and a conductive thin substrate connected to a distal side, which is provided by the connecting board and is away from the conductive member. The control chip is disposed on the conductive thin substrate, and is electrically connected with the second conductive wire through the conductive thin substrate.

In one embodiment, the electronic device further comprises a driving circuit board connected to a distal side, which is provided by the conductive thin substrate and is away from the connecting board, and the driving circuit board is electrically connected with the component board through the conductive thin substrate and the connecting board.

In one embodiment, the electronic device further comprises a control chip disposed on the connecting board and electrically connected with the second conductive wire.

In one embodiment, the electronic device further comprises a driving circuit board connected to a distal side, which is provided by the connecting board and is away from the conductive member, and the driving circuit board is electrically connected with the component board through the connecting board.

In one embodiment, the electronic device further comprises a support member disposed on a second surface of the substrate, in which the second surface is opposite to the first surface. The connecting board defines a first subsection, a curved section, and a second subsection in order; the curved section of the connecting board is bent to acquiesce that the second subsection of the connecting board aligns to the second surface of the substrate of the component board and connects with the support member while the first subsection of the connecting board faces the lateral face of the substrate of the component board.

In one embodiment, the attaching member is formed by curing an attaching material.

In one embodiment, the conductive member is formed by spray coating a conductive material in the recess and then curing the conductive material.

In one embodiment, the manufacturing method further comprises steps of: providing a conductive thin substrate and a control chip, wherein the control chip is disposed on the conductive thin substrate; and connecting the conductive thin substrate to a distal side of the connecting board, in which the distal side is away from the conductive member, wherein the control chip is electrically connected with the second conductive wire through the conductive thin substrate.

In one embodiment, the manufacturing method further comprises a step of: connecting a driving circuit board to a distal side of the conductive thin substrate, in which the distal side is away from the connecting board, wherein the driving circuit board is electrically connected with the component board through the conductive thin substrate and the connecting board.

In one embodiment, the manufacturing method further comprises a step of: disposing a control chip on the connecting board, wherein the control chip is electrically connected with the second conductive wire.

In one embodiment, the manufacturing method further comprises a step of: connecting a driving circuit board to a distal side of the connecting board, in which the distal side is away from the conductive member, wherein the driving circuit board is electrically connected with the component board through the connecting board.

In one embodiment, the manufacturing method further comprises steps of: disposing a support member on a second surface of the substrate, in which the second surface is opposite to the first surface; and bending the connecting board to form a curved section, wherein the connecting board aligns to the second surface of the substrate of the component board due to the curved section and is then connected with the support member, while faces the lateral face of the substrate of the component board.

As mentioned above, in the electronic device and the manufacturing method thereof of this disclosure, the connecting board is connected to the lateral face of the component board through the attaching member, and the conductive member is disposed in the recess formed by the lateral face, the attaching member and the connecting board. Thus, the component board can be electrically connected with the connecting board through the conductive member. According to this structural design, the module composed of the component board and the connecting board can be used as the joint part of a narrow border product, thereby providing the narrow border feature of the electronic device so as to improve the product competitiveness.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
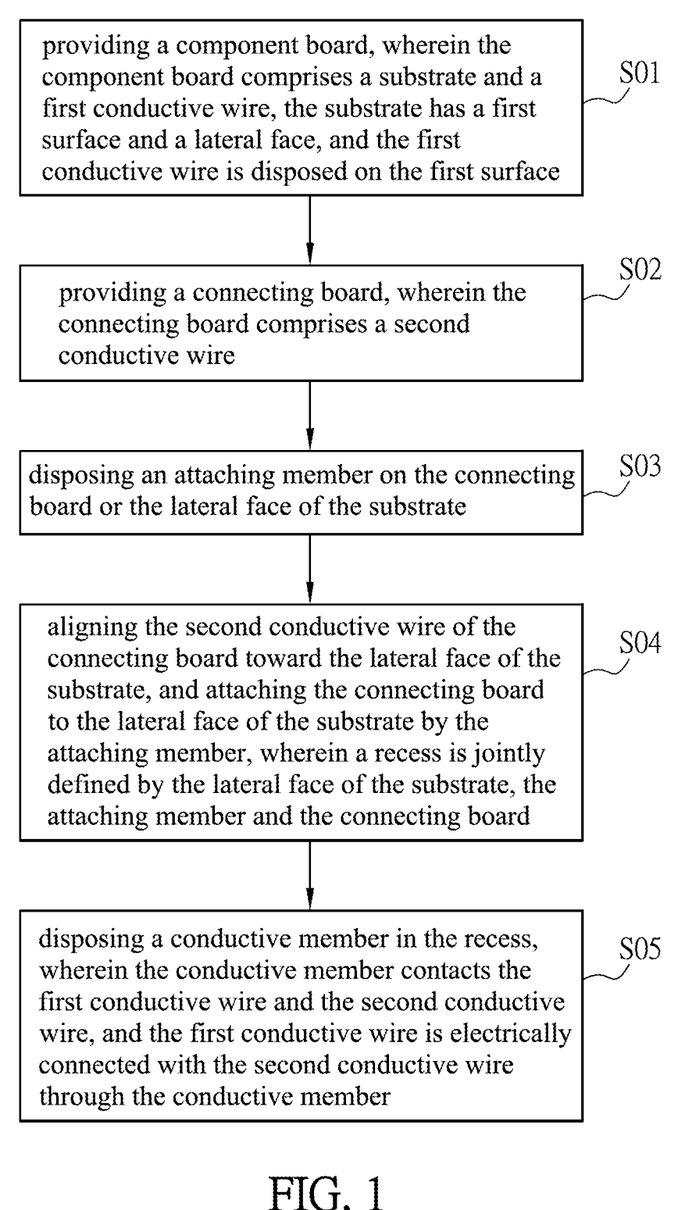
FIG. 1 is a flow chart of a manufacturing method of an electronic device according to an embodiment of this disclosure.

FIG. 1 is a flow chart of a manufacturing method of an electronic device according to an embodiment of this disclosure. The "electronic device" described in the following embodiments can be, for example but not limited to, an LED display device, a Mini LED display device, a Micro LED (pLED) display device, an LED illumination device, a Mini LED illumination device, a Micro LED illumination device, or any of other flat electronic device and display device. This disclosure is not limited thereto.

As shown in FIG. 1, the manufacturing method of an electronic device comprises the following steps of: providing a component board, wherein the component board comprises a substrate and a first conductive wire, the substrate has a first surface and a lateral face, and the first conductive wire is disposed on the first surface (step S01); providing a connecting board, wherein the connecting board comprises a second conductive wire (step S02); disposing an attaching member on the connecting board or the lateral face of the substrate (step S03); aligning the second conductive wire of the connecting board toward the lateral face of the substrate, and attaching the connecting board to the lateral face of the substrate by the attaching member, wherein a recess is jointly defined by the lateral face of the substrate, the attaching member and the connecting board (step S04); and disposing a conductive member in the recess, wherein the conductive member contacts the first conductive wire and the second conductive wire, and the first conductive wire is electrically connected with the second conductive wire through the conductive member (step S05).

The details of the steps S01 to S05 will be described hereinafter with reference to FIG. 1 in view of FIGS. 2A to 2D. FIGS. 2A to 2D are schematic diagrams showing the manufacturing procedure of an electronic device 1 according to an embodiment of this disclosure.

Figure 2A:
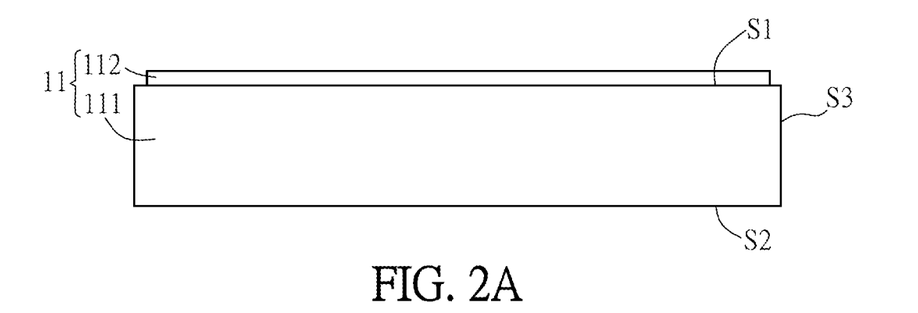
FIGS. 2A to 2D are schematic diagrams showing the manufacturing procedure of the electronic device according to an embodiment of this disclosure.

Referring to FIG. 2A, the step S01 is to provide a component board 11. The component board 11 comprises a substrate 111 and at least one first conductive wire 112. The substrate 111 has a first surface S1, a second surface S2, and a lateral face S3. In this embodiment, the first surface S1 and the second surface S2 are opposite surfaces (upper and lower surfaces) of the substrate 111, and the lateral face S3 connects the first surface S1 and the second surface S2. The first conductive wire 112 is disposed on the first surface S1 by, for example, the semiconductor thin-film process or any of other suitable manufacturing processes. In some embodiments, the component board 11 is a circuit substrate, such as an AM (active matrix) circuit substrate or a PM (passive matrix) circuit substrate, which is configured with conductive wires, conductive layers, insulation layers, components (e.g. thin-film transistors, light-emitting elements, or sensing elements), or other layers. For example, the AM circuit substrate (the component board 11) may comprise a substrate 111 and a matrix circuit, and the matrix circuit may comprise, for example, a plurality of scan lines, a plurality of data lines, a plurality of first conductive wires 112, a plurality of AM components (e.g. TFTs), and/or a plurality of light-emitting semiconductor elements (e.g. LEDs, Mini LEDs, or Micro LEDs) array. These scan lines, data lines, first conductive wires 112, AM components, and/or light-emitting semiconductor elements (e.g. LEDs, Mini LEDs, or Micro LEDs) array can be disposed on the first surface S1 of the substrate 111, and the first conductive wires 112 are electrically connected with the corresponding light-emitting semiconductor elements, respectively. The electrical signals can be transmitted through the AM components and the first conductive wires 112 for controlling the corresponding light-emitting semiconductor elements to emit light.

In practice, the substrate 111 can be a flexible substrate or a rigid substrate, and can be made of transparent or opaque materials. For example, the transparent material can be, for example, glass, quartz, sapphire or the like, plastic, rubber, glass fiber, or other polymer materials. Preferably, the transparent material can be boron silicate (e.g. a boron silicate glass substrate) or an organic polymer material. In some embodiments, the above organic polymer material is, for example but not limited to, polyimide (PI), polycarbonate (PC), or polyethylene terephthalate (PET).

Figure 2B:
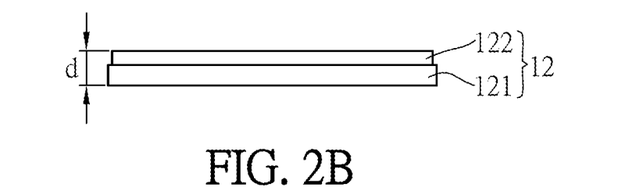

Next, as shown in FIG. 2B, the step S02 is to provide a connecting board 12, wherein the connecting board 12 comprises at least one second conductive wire 122 and a thin substrate 121, and the second conductive wire 122 is disposed on the thin substrate 121. In this embodiment, the thin substrate 121 of the connecting board 12 is a flexible substrate or a rigid substrate, which is thin enough for the connecting board 12 to be bendable, and this disclosure is not limited. In some embodiments, the connecting board 12 has a thickness d, such as, for example, greater than or equal to 10 μm and less than or equal to 200 μm (10 μm≤d≤200 μm). The second conductive wire 122 is disposed on the flexible substrate 121. Herein, the second conductive wire 122 can be formed on the flexible substrate 121 by, for example, semiconductor thin-film process or any of other suitable manufacturing processes. In some embodiments, the connecting board 12 comprises a plurality of second conductive wires 122 disposed thereon and corresponding to a plurality of first conductive wires 112 of the component board 11.

The flexible substrate 121 is flexible and bendable, and may comprise organic polymer materials. The glass transition temperature (Tg) of the organic polymer material is between 200° C. and 600° C. The high glass transition temperature allows the flexible substrate 121 to remain the properties thereof in the following manufacturing processes. In this embodiment, the organic polymer material can be a thermoplastic material such as polyimide (PI), polyethylene (PE), polyvinylchloride (PVC), PS, acrylic, fluoropolymer, polyester, or nylon. In this embodiment, the flexible substrate 121 is made of polyimide for example.

To be noted, the order of the steps S01 and S02 is not limited. In more detailed, the step S01 can be performed before or after the step S02.

Figure 2C:
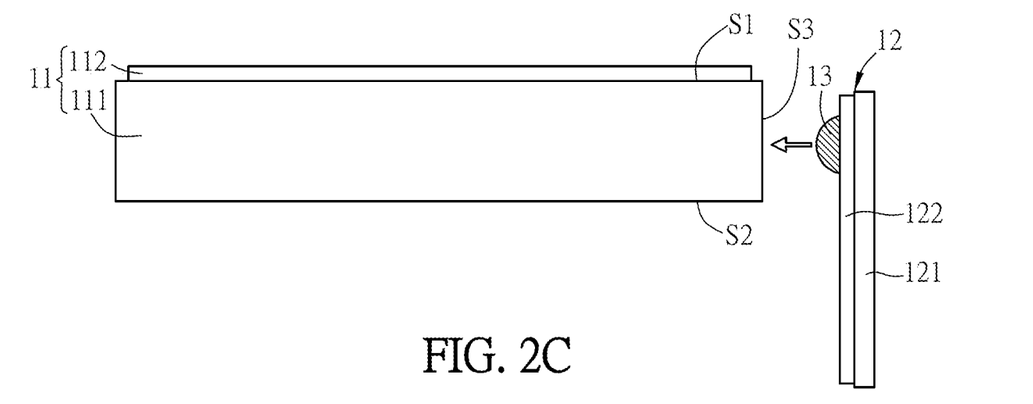

Afterwards, as shown in FIG. 2C, the step S03 is to dispose an attaching member 13 on the connecting board 12 or the lateral face S3 of the substrate 111. To be noted, the attaching member 13 could be disposed on the thin substrate 121, the second conductive wire 122, or another component/member of the connecting board 12. For example, the attaching member 13 could be disposed on a protection payer of the connecting board 12, and the disclosure is not limited. In this embodiment, the attaching member 13 is disposed on the second conductive wire 122 of the connecting board 12 for attaching the component board 11 to the connecting board 12 in the following step. In this embodiment, the attaching material is disposed on the connecting board 12, and then the curing process is performed to form the attaching member 13. The attaching material can be an insulation adhesive such as, for example but not limited to, epoxy resin, double-sided adhesive, thermal melting adhesive, light curing adhesive, or heat curing adhesive, which can be disposed on the connecting board 12 or the lateral face S3 of the substrate 111 by coating or dispensing.

Figure 2D:
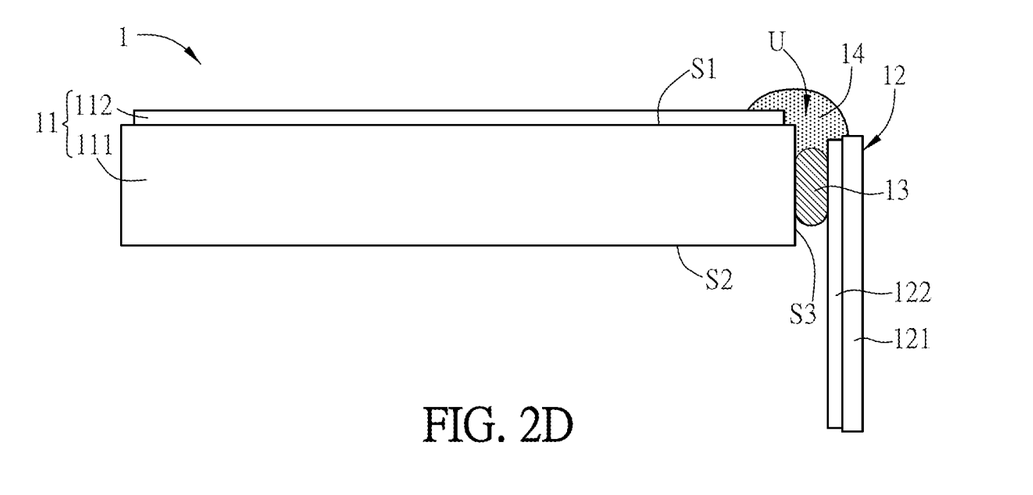

Referring to FIGS. 2C and 2D, the step S04 is to align the second conductive wire 122 of the connecting board 12 toward the lateral face S3 of the substrate 111, and to attach the connecting board 12 to the lateral face S3 of the substrate 111 by the attaching member 13, wherein a recess U (see FIG. 2D) is jointly defined by the lateral face S3 of the substrate 111, the attaching member 13, and the connecting board 12. In this embodiment, the connecting board 12 is attached to the lateral face of the component board 11, in which the attaching member 13 is located between the connecting board 12 and the component board 11 for physically connection therebetween and for forming the recess U to accommodate the conductive member 14 in the following step.

Then, the step S05 is to dispose a conductive member 14 in the recess U, wherein the conductive member 14 contacts the first conductive wire 112 of the component board 11 and the second conductive wire 122 of the connecting board 12, and the first conductive wire 112 of the component board 11 is electrically connected with the second conductive wire 122 of the connecting board 12 through the conductive member 14. To be noted, a plurality of the conductive members 14 may be provided for respectively connecting and electrically specific traces of the first conductive wire 112 to specific traces of the second conductive wire 122. In another embodiment, the conductive member 14, which is featured of self-aligned per se, could be an integrity and also to be provided for respectively and electrically connecting specific traces of the first conductive wire 112 to specific traces of the second conductive wire 122. The disclosure is not limited thereto. Since the lateral face S3 of the substrate 111, the attaching member 13, and the connecting board 12 together form the recess U, the conductive material can be disposed in the recess U by, for example, spray coating and then cured to form the conductive member 14. Accordingly, the formed conductive member 14 can contact the first conductive wire 112 and the second conductive wire 122, so as to the component board 11 is electrically connected with the connecting board 12 through the conductive member 14. In this embodiment, the conductive material may comprise copper paste, silver paste, solder paste, or anisotropic conductive adhesive (ACP), or any of other suitable conductive materials. This disclosure is not limited. In this embodiment, the conductive member 14 extends to partially cover a top of the first conductive wire 112 of the component substrate 11 and to approach an edge of the second conductive wire 122 of the connecting board 12, so that the first conductive wire 112 and the second conductive wire 122 are securely connected by the conductive member 14. As a result, the first conductive wire 112 can be electrically connected with the second conductive wire 122 through the conductive member 14. To be noted, the term "the conductive member 14 disposed in the recess U" means not only "the conductive member 14 disposed within the recess U" but also "the conductive member 14 goes further to exceed the recess U".

As shown in FIG. 2D, the electronic device 1 of this embodiment comprises a component board 11, a connecting board 12, an attaching member 13, and a conductive member 14. The component board 11 comprises a substrate 111 and at least one first conductive wire 112. The substrate 111 has a first surface S1, a second surface S2, and a lateral face S3, and the first conductive wire 112 is disposed on the first surface S1. The connecting board 12 comprises a flexible substrate 121 and at least one second conductive wire 122, which is disposed on the flexible substrate 121 and aligned toward the lateral face S3 of the substrate 111. The attaching member 13 is disposed between the lateral face S3 of the substrate 111 and the second conductive wire 122, and the attaching member 13 attaches to the component board 11 and the connecting board 12. The lateral face S3 of the substrate 111, the attaching member 13, and the connecting board 12 together form a recess U. The conductive member 14 is disposed in the recess U and contacts the first conductive wire 112 and the second conductive wire 122. Accordingly, the first conductive wire 112 is electrically connected with the second conductive wire 122 through the conductive member 14, thereby electrically connecting the connecting board 12 to the component board 11 through the conductive member 14.

As mentioned above, in the electronic device 1 of this embodiment, the connecting board 12 is connected to the lateral face of the component board 11 through the attaching member 13, and the conductive member 14 is disposed in the recess U, which is jointly defined by the lateral face S3 of the component board 11, the attaching member 13, and the connecting board 12. Thus, the component board 11 can be electrically connected with the connecting board 12 through the conductive member 14. According to this structural design, a combination composed of the component board 11 with the connecting board 12, the narrow border feature of the electronic device 1 is somehow accomplished, thereby improving the product competitiveness.

FIGS. 3A to 3E are schematic diagrams showing the manufacturing procedure of an electronic device 1a according to another embodiment of this disclosure.

Figure 3A:
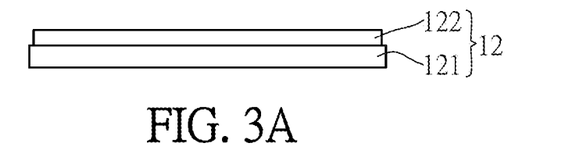
FIGS. 3A to 3E are schematic diagrams showing the manufacturing procedure of the electronic device according to another embodiment of this disclosure.
Figure 3B:
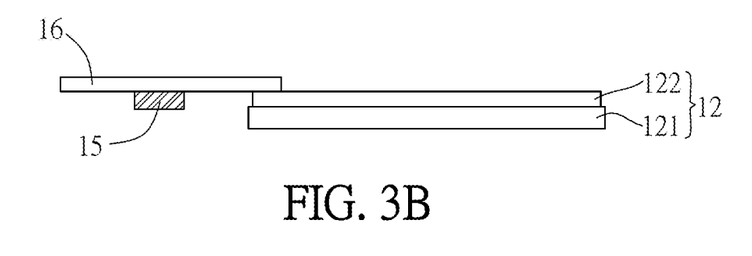

Referring to FIG. 3A, in the manufacturing procedure of the electronic device 1a, after the step S01 of providing the component board 11, two steps are performed instead of the above-mentioned step S02. As shown in FIG. 3B, the two steps after the step S01 is to provide a conductive thin substrate 16 and a control chip 15, wherein the control chip 15 is disposed on the conductive thin substrate 16; and to connect the conductive thin substrate 16 to a distal side of the connecting board 12, in which the distal side is away from the conductive member; wherein the control chip 15 is electrically connected with the second conductive wire 122 of the connecting board 12 through the conductive thin substrate 16. In this embodiment, the control chip 15 is disposed on the conductive thin substrate 16 and then reversed, so that the control chip 15 is disposed upside down with respect to the second conductive wire 122. Then, the conductive thin substrate 16 is electrically connected with the connecting board 12. Herein, the conductive thin substrate can be, for example but not limited to, a conductive film, and the control chip 15 can be disposed on the conductive thin substrate 16 by, for example, the COF (chip on film) technology. Afterwards, the conductive thin substrate 16 is connected to one side of the connecting board 12, so that the control chip 15 can be electrical connected with the second conductive wire 122 of the connecting board 12 through the conductive thin substrate 16. To be noted, the above-mentioned two steps are performed after the step S01 and before the step S02, so that the manufacturing process for connecting the conductive thin substrate 16 and the connecting board 12 is easier. In other words, the manufacturing procedure of connecting the connecting board 12 to the lateral face S3 of the substrate 111 and then connecting the conductive thin substrate 16 to the connecting board 12 is more difficult.

Figure 3C:
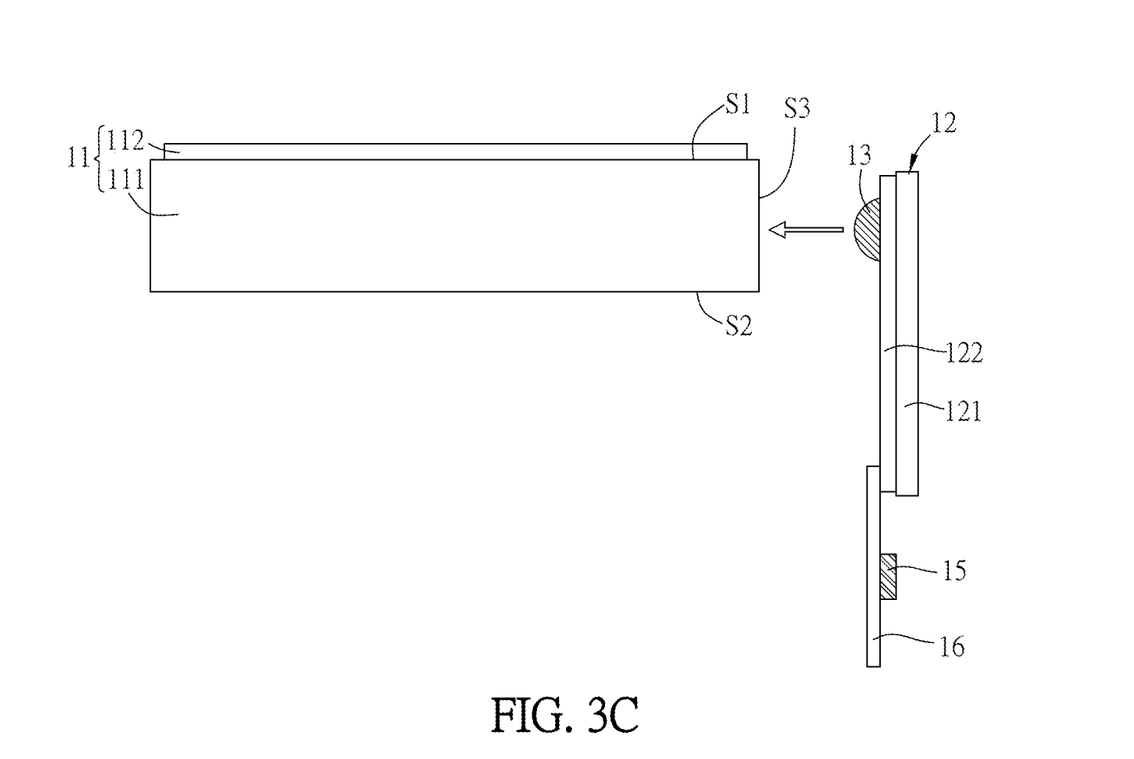
Figure 3D:
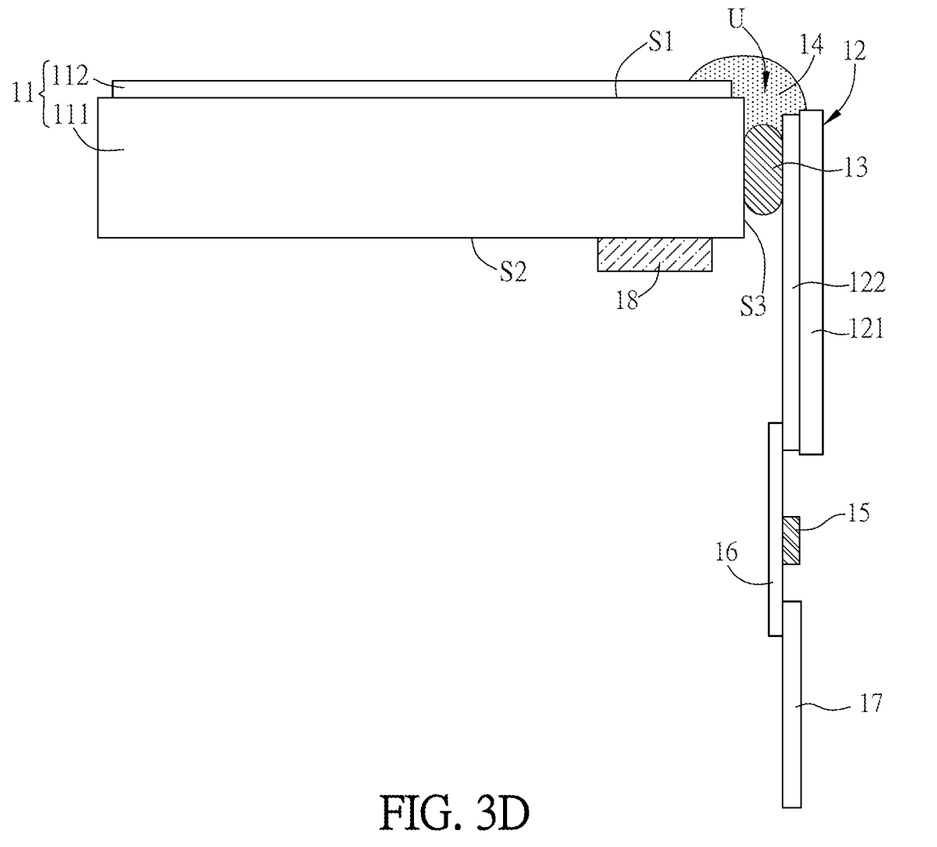

Referring to FIGS. 3C and 3D, the steps S03 and S04 are performed to dispose an attaching member 13 on the connecting board 12 and to attach the connecting board 12 to the lateral face S3 of the substrate 111 by the attaching member 13, wherein the lateral face S3 of the substrate 111, the attaching member 13, and the connecting board 12 form a recess U together. Next, the step S05 is performed to dispose a conductive member 14 in the recess U, wherein the conductive member 14 contacts the first conductive wire 112 and the second conductive wire 122, and the first conductive wire 112 is electrically connected with the second conductive wire 122 through the conductive member 14. In this embodiment, the conductive member 14 extends to partially cover a top of the first conductive wire 112 of the component board 11 and to approach an edge of the second conductive wire 122 of the connecting board 12, so that the first conductive wire 112 can be electrically connected with the second conductive wire 122 through the conductive member 14. In addition, since the control chip 15 is electrically connected with the second conductive wire 122 of the connecting board 12 through the conductive thin substrate 16, and the second conductive wire 122 is electrically connected with the first conductive wire 112 through the conductive member 14, the control chip 15 can be electrically connected to the component board 11 through the conductive thin substrate 16 and the connecting board 12. Therefore, the control chip 15 can control the component board 11.

Moreover, as shown in FIG. 3D, the manufacturing method of this embodiment further comprises a step of: connecting a driving circuit board 17 to a distal side of the conductive thin substrate 16, in which the distal side is away from the connecting board 12, wherein the driving circuit board 17 is electrically connected with the component board 11 through the conductive thin substrate 16 and the connecting board 12. In this embodiment, the driving circuit board 17 can be a system circuit board of the electronic device 1a such as, for example but not limited to, a printed circuit board. The driving circuit board 17 is electrically connected with the component board 11 through the conductive thin substrate 16 and the connecting board 12, and the driving circuit board 17 can drive the component board 11 or control the operation of the component board 11. To be noted, the manufacturing process for connecting the driving circuit board 17 to the conductive thin substrate 16 is performed after the step S05 of disposing the conductive member 14 in the recess U. In other embodiments, the manufacturing process for connecting the driving circuit board 17 to the conductive thin substrate 16 can be performed before the step S05, and can be further performed after the step S04 of connecting the conductive thin substrate 16 to the connecting board 12. This disclosure is not limited thereto.

Figure 3E:
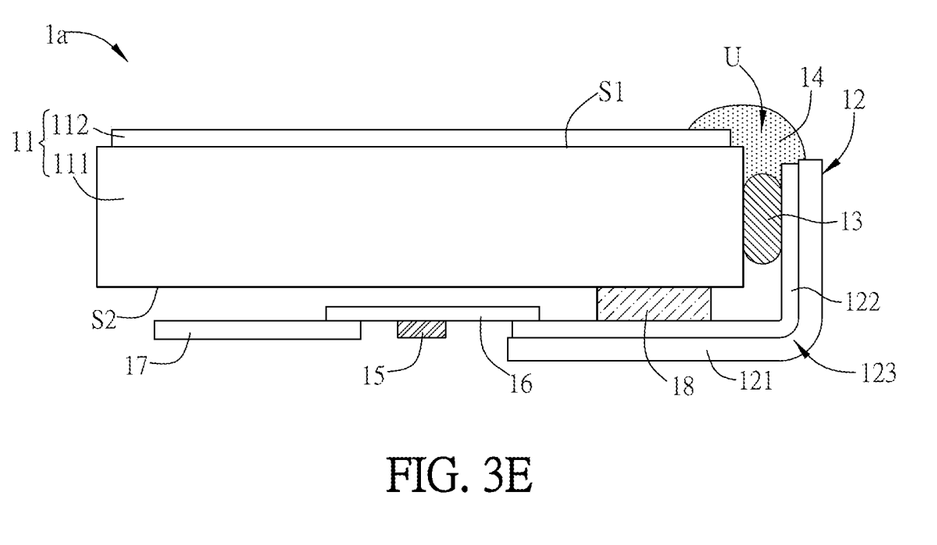

In order to manufacture the electronic device 1a with a thin structure, as shown in FIG. 3E, the manufacturing method of this embodiment further comprises steps of: disposing a support member 18 on the second surface S2 of the substrate 111; and bending the connecting board 12 to form a curved section 123, which the connecting board 12 aligns the second surface S2 of the substrate 111 of the component board 11 due to the curved section 123 and is then connected with the support member 18, while faces the lateral face S3 of the substrate 111 of the component board 11. To be detailed description, the connecting board 12 further defines a first subsection, the curved section 123, and a second subsection in order. The first subsection is where the conductive member 14 contacts, and the second subsection is where the conductive member 14 stays away. The curved section 123 defines two opposite sides; one side jointing the first subsection, and the other side jointing the second subsection. Therefore, the curved section 123 of the connecting board 12 is configured to be bent so as to acquiesce that the second subsection of the connecting board 12 aligns to the second surface S2 of the substrate 111 of the component board 11 and connects with the support member 18 while the first subsection of the connecting board 12 faces the lateral face S3 of the substrate 111 of the component board 11. In this embodiment, the support member 18 is disposed on the second surface S2 of the substrate 111 and is configured corresponding to the connecting board 12 for connecting the substrate 111 and the connecting board 12 after the connecting board 12 is bent. In other embodiments, the support member 18 can be configured to correspond to the conductive thin substrate 16 or the driving circuit board 17 for connecting the conductive thin substrate 16 and the driving circuit board 17. This disclosure is not limited thereto. Since the connecting board 12 of this embodiment comprises a thin substrate 121 which is bendable, the connecting board 12 can be bent to form the curved section 123 to acquiesce the second subsection of the connecting board 12 moving toward the lower surface, which is the second surface S2, of the component board 11, thereby approaching to connect the second conductive wire 122 of the connecting board 12 to the support member 18. In order to attach the connecting board 12 to the second surface S2 of the component board 11 and secure the relative positions thereof, the upper and lower surfaces of the support member 18 can be configured with an adhesive material (not shown) for adhering the substrate 111 and the connecting board 12, respectively, or for adhering the substrate 111 and the conductive thin substrate 16 or the driving circuit board 17. Alternatively, the support member 18 can be made of adhesive material, and this disclosure is not limited thereto. Accordingly, the curved connecting board 12 can be attached to the lateral face S3 and the second surface S2 of the component board 11, thereby decreasing the entire thickness of the electronic device 1a.

As shown in FIG. 3E, except the component board 11, the connecting board 12, the attaching member 13, and the conductive member 14, the electronic device 1a further comprises the control chip 15, the conductive thin substrate 16, the driving circuit board 17, and the support member 18. In this embodiment, the conductive thin substrate 16 is connected to a distal side, which is provided by the connecting board 12 and is away from the conductive member 14. The control chip 15 is disposed on the conductive thin substrate 16, and is electrically connected with the second conductive wire 122 through the conductive thin substrate 16. In addition, the driving circuit board 17 is connected to a distal side, which is provided by of the conductive thin substrate 16 and is away from the connecting board 12, and the driving circuit board 17 is electrically connected with the component board 11 through the conductive thin substrate 16 and the connecting board 12. Accordingly, the driving circuit board 17 and/or the control chip 15 can drive or control the component board 11 through the conductive thin substrate 16 and the connecting board 12, thereby controlling the operation of the component board 11. Moreover, the support member 18 is disposed on the second surface S2 of the substrate 111, and the configuration of the curved section 123 of the connecting board 12 allows the connecting board 12 to be attached to the lower surface of the component board 11 through the support member 18.

As a result, in the electronic device 1a of this embodiment, the connecting board 12 is also attached to the lateral face S3 of the component board 11 through the attaching member 13, so that a combination composed of the component board 11 and the connecting board 12 is advantageous of: multiple combinations tiled together thereby constructing the narrow border feature of the electronic device 1a.

Figure 4A:
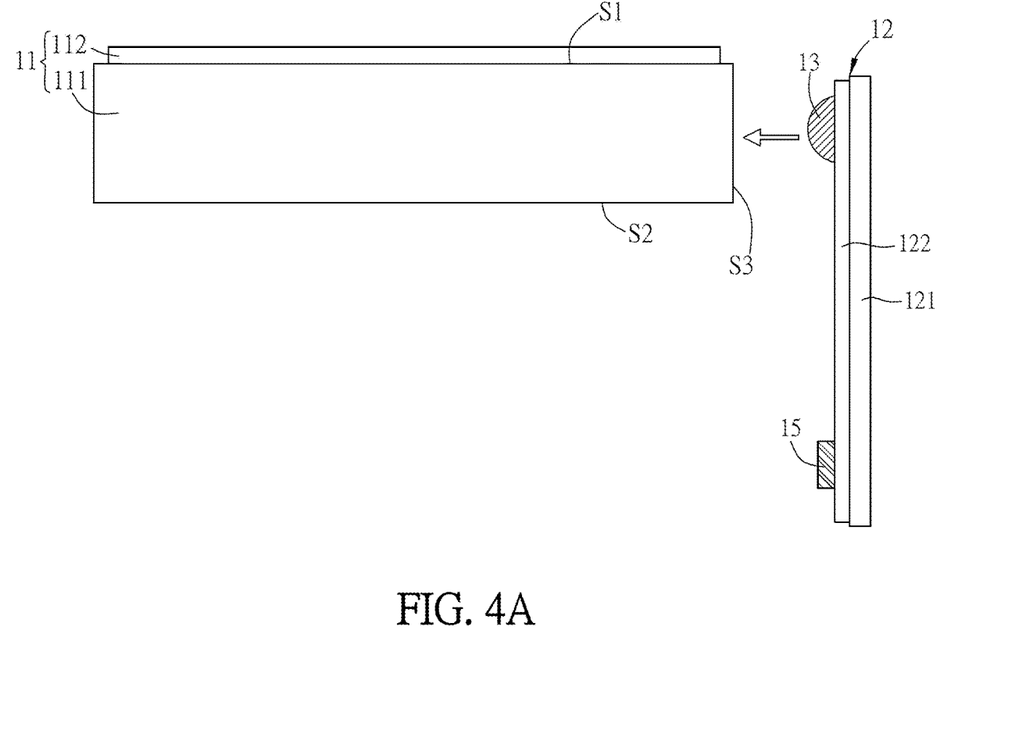
FIGS. 4A to 4C are schematic diagrams showing the manufacturing procedure of the electronic device according to another embodiment of this disclosure.
Figure 4B:
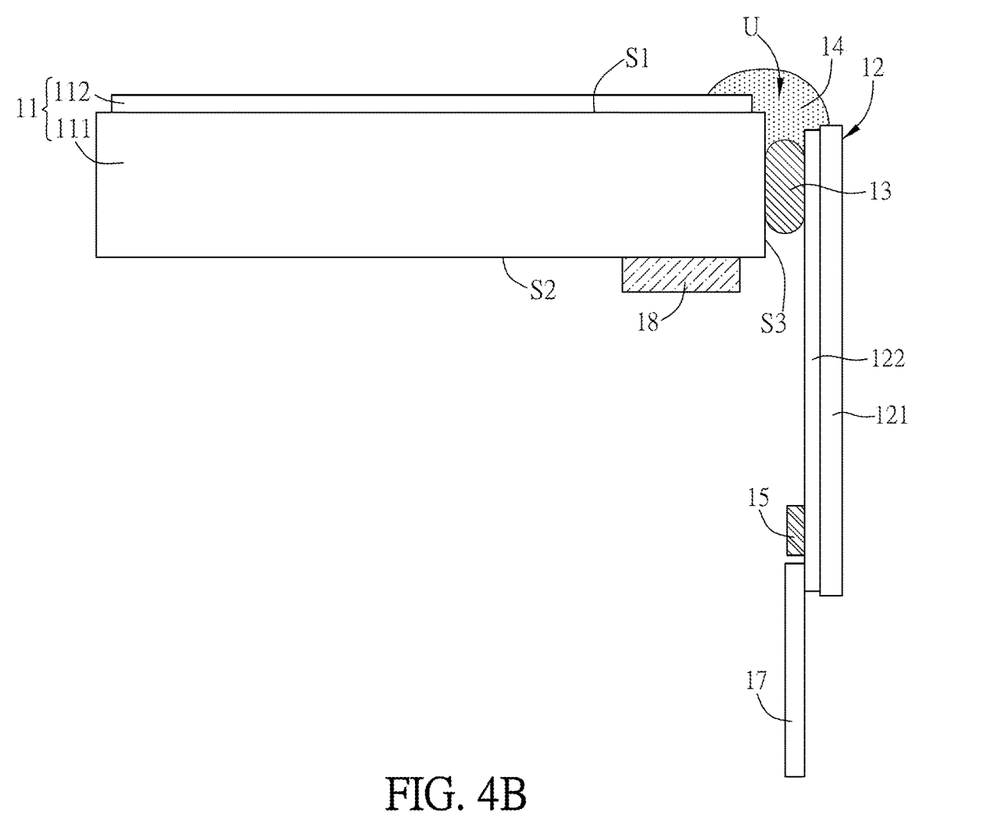
Figure 4C:
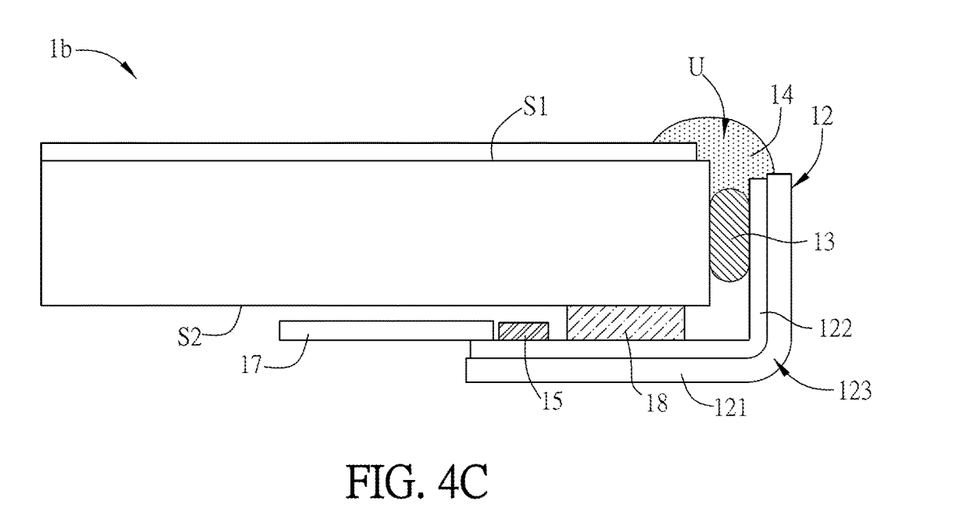

FIGS. 4A to 4C are schematic diagrams showing the manufacturing procedure of an electronic device 1b according to another embodiment of this disclosure.

As shown in FIG. 4A, the manufacturing method of the electronic device 1b of this embodiment is mostly the same as that of the electronic device 1a of the previous embodiment. Different from the previous embodiment, the electronic device 1b of this embodiment does not contain the conductive thin substrate. In electronic device 1b, the control chip 15 is directly disposed on one distal side, which is provided by the connecting board 12 and is away from the conductive member 14, so that the control chip 15 is electrically connected with the second conductive wire 122 of the connecting board 12. Furthermore, the control chip 15 can be electrically connected with the component board 11 through the connecting board 12. The step of disposing the control chip 15 on the connecting board 12 can be performed right after the step S02 (providing the connecting board 12). As shown in FIG. 4B, after the step S04 of attaching the connecting board 12 to the lateral face S3 of the component board 11 by the attaching member 13 and the step S05 of electrically connecting the first conductive wire 112 to the second conductive wire 122 through the conductive member 14, the driving circuit board 17 is connected to one distal side, which is provided by the connecting substrate 12. Accordingly, the driving circuit board 17 and the control chip 15 can be electrically connected with the component board 11 through the connecting board 12. Of course, the step of disposing the driving circuit board 17 can also be performed before the step S04 of attaching the connecting board 12 to the lateral face S3 of the component board 11 by the attaching member 13. Finally, as shown in FIG. 4C, the connecting board 12 is bent to form a curved section 123, so that the second subsection of the connecting board 12 can be further attached to the second surface S2 of the component board 11 through the support member 18, thereby manufacturing the electronic device 1b of this embodiment. Since the electronic device 1b does not use the above-mentioned conductive thin substrate but directly disposes the control chip 15 on the connecting board 12, the cost for the conductive thin substrate can be saved, thereby decreasing the cost of the electronic device 1b.

In summary, in the electronic device and the manufacturing method thereof of this disclosure, the connecting board is connected to the lateral face of the component board through the attaching member, and the conductive member is disposed in the recess formed by the lateral face, the attaching member and the connecting board. Thus, the component board can be electrically connected with the connecting board through the conductive member. According to this structural design, the combination composed of the component board and the connecting board is advantageous of narrow border, and plural of the combinations tiled together is thereby to construct the narrow-border feature of the electronic device. Consequently, the product competitiveness is strengthened.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. An electronic device, comprising:
   a component board comprising a substrate and a first conductive wire, wherein the substrate has a first surface and a lateral face, and the first conductive wire is disposed on the first surface of the substrate;
   a connecting board comprising a thin substrate and a second conductive wire, wherein the second conductive wire is disposed on the thin substrate and aligned toward the lateral face of the substrate;
   an attaching member disposed between the lateral face of the substrate and the second conductive wire of the connecting board, wherein a recess is jointly defined by the lateral face of the substrate, the attaching member and the connecting board; and
   a conductive member disposed in the recess and contacting the first conductive wire and the second conductive wire, wherein the first conductive wire is electrically connected with the second conductive wire through the conductive member.

2. The electronic device according to claim 1, wherein the thin substrate of the connecting board is a flexible substrate, and the second conductive wire is disposed on a surface of the flexible substrate, which is aligned toward the lateral face of the substrate.

3. The electronic device according to claim 2, wherein the flexible substrate comprises an organic polymer material, and a glass transition temperature of the organic polymer material is between 200° C. and 600° C.

4. The electronic device according to claim 1, wherein a thickness of the connecting board is greater than or equal to 10 μm and is less than or equal to 200 μm.

5. The electronic device according to claim 1, wherein a material of the conductive member comprises copper paste, silver paste, solder paste, or anisotropic conductive adhesive.

6. The electronic device according to claim 1, further comprising:
   a control chip; and
   a conductive thin substrate connected to a distal side, which is provided by the connecting board and is away from the conductive member, wherein the control chip is disposed on the conductive thin substrate, and is electrically connected with the second conductive wire through the conductive thin substrate.

7. The electronic device according to claim 6, further comprising:
   a driving circuit board connected to a distal side, which is provided by the conductive thin substrate and is away from the connecting board, wherein the driving circuit board is electrically connected with the component board through the conductive thin substrate and the connecting board.

8. The electronic device according to claim 1, further comprising:
   a control chip disposed on the connecting board and electrically connected with the second conductive wire.

9. The electronic device according to claim 8, further comprising:
   a driving circuit board connected to a distal side, which is provided by the connecting board and is away from the conductive member, wherein the driving circuit board is electrically connected with the component board through the connecting board.

10. The electronic device according to claim 1, further comprising:
    a support member disposed on a second surface of the substrate of the component board, wherein the second surface is opposite to the first surface, the connecting board defines a first subsection, a curved section, and a second subsection in order, the curved section of the connecting board is bent to acquiesce that the second subsection of the connecting board aligns to the second surface of the substrate of the component board and connects with the support member while the first subsection of the connecting board faces the lateral face of the substrate of the component board.

11. A manufacturing method of an electronic device, comprising:
    providing a component board, wherein the component board comprises a substrate and a first conductive wire, the substrate has a first surface and a lateral face, and the first conductive wire is disposed on the first surface of the substrate;
    providing a connecting board, wherein the connecting board comprises a second conductive wire;
    disposing an attaching member on the connecting board or the lateral face of the substrate of the component board;
    facing the second conductive wire of the connecting board toward the lateral face of the substrate, and attaching the connecting board to the lateral face of the substrate by the attaching member, wherein a recess is jointly defined by the lateral face of the substrate, the attaching member and the connecting board; and
    disposing a conductive member in the recess, wherein the conductive member contacts the first conductive wire of the component board and the second conductive wire of the connecting board, and the first conductive wire of the component board is electrically connected with the second conductive wire of the connecting board through the conductive member.

12. The manufacturing method according to claim 11, wherein the connecting board further comprises a flexible substrate, the flexible substrate comprises an organic polymer material, and a glass transition temperature of the organic polymer material is between 200° C. and 600° C.

13. The manufacturing method according to claim 11, wherein a thickness of the connecting board is greater than or equal to 10 μm and is less than or equal to 200 μm.

14. The manufacturing method according to claim 11, wherein the attaching member is formed by curing an attaching material.

15. The manufacturing method according to claim 11, wherein the conductive member is formed by spray coating a conductive material in the recess and then curing the conductive material.

16. The manufacturing method according to claim 11, further comprising:
    providing a conductive thin substrate and a control chip, wherein the control chip is disposed on the conductive thin substrate; and
    connecting the conductive thin substrate to a distal side of the connecting board, wherein the distal side is away from the conductive member, and the control chip is electrically connected with the second conductive wire through the conductive thin substrate.

17. The manufacturing method according to claim 16, further comprising:

connecting a driving circuit board to a distal side of the conductive thin substrate, wherein the distal side is away from the connecting board, and the driving circuit board is electrically connected with the component board through the conductive thin substrate and the connecting board.

18. The manufacturing method according to claim 11, further comprising:

disposing a control chip on the connecting board, wherein the control chip is electrically connected with the second conductive wire.

19. The manufacturing method according to claim 18, further comprising:

connecting a driving circuit board to a distal side of the connecting board, wherein the distal side is away from the conductive member, and the driving circuit board is electrically connected with the component board through the connecting board.

20. The manufacturing method according to claim 11, further comprising:

disposing a support member on a second surface of the substrate, wherein the second surface is opposite to the first surface; and bending the connecting board to form a curved section, wherein the connecting board aligns the second surface of the substrate of the component board due to the curved section and is then connected with the support member, while faces the lateral face of the substrate of the component board.

* * * * *